(12) United States Patent
Hori et al.

(10) Patent No.: US 7,352,316 B2
(45) Date of Patent: Apr. 1, 2008

(54) TIME-INTERLEAVED AD CONVERTER

(75) Inventors: Kazuyuki Hori, Tokyo (JP); Yuji Ishida, Fujisawa (JP); Toshiaki Kurokawa, Fujisawa (JP); Keiichi Hirota, Yokohama (JP); Shouhei Murakami, Yokohama (JP)

(73) Assignee: Hitachi Communication Technologies, Ltd., Tokyo (JP)

( * ) Notice: Subject to any disclaimer, the term of this patent is extended or adjusted under 35 U.S.C. 154(b) by 0 days.

(21) Appl. No.: 11/602,355

(22) Filed: Nov. 21, 2006

(65) Prior Publication Data
US 2007/0120724 A1 May 31, 2007

(30) Foreign Application Priority Data
Nov. 28, 2005 (JP) .............................. 2005-341356

(51) Int. Cl.
*H03M 1/12* (2006.01)
(52) U.S. Cl. ...................... 341/155; 341/159
(58) Field of Classification Search ................ 341/155, 341/161, 141, 159
See application file for complete search history.

(56) References Cited

U.S. PATENT DOCUMENTS 6,999,733 B2  2/2006  Hori et al. ............... 455/114.2
7,250,885 B1 *  7/2007  Nairn ........................ 341/141
7,280,091 B2 *  10/2007  Wang et al. ................ 345/96
2003/0108120 A1  6/2003  Hori et al. .................. 375/297

FOREIGN PATENT DOCUMENTS

JP  2004-165988  11/2002
JP  2004-328436  4/2003

OTHER PUBLICATIONS

Yuki Iikuni, "Adaptable Signal Algorithms", Baifukan Co., Ltd.., pp. 10-19 in English, pp. 110-115 in Japanese, no date.
S. Heikin, "Introduction to Adaptable Filters", Modern Engineering Corp., pp. 1-9 in English, pp. 10-11 and 140-145 in Japanese, no date.

* cited by examiner

*Primary Examiner*—Peguy JeanPierre
(74) *Attorney, Agent, or Firm*—Reed Smith LLP; Stanley P. Fisher, Esq.; Juan Carlos A. Marquez, Esq.

(57) ABSTRACT

In a time-interleaved AD converter which combines together low-speed high-resolution AD converters for effective high speed operation, various deterioration factors possessed by each of the converters, including DC offset, conversion gain error, sampling timing error, and a frequency characteristic, need to be compensated. The compensation is performed through nonlinear filter operation in which a constant term is added to linear filter operation. A high-speed low-resolution AD converter is separately used, and through adaptive signal processing in which an output signal thereof is defined as an instruction signal, a compensation coefficient is calculated. In this condition, the compensation can be performed without the influence of quantization noise attributable to the high-speed low-resolution AD converter.

6 Claims, 12 Drawing Sheets

TIME-INTERLEAVED AD CONVERTER

CLAIM OF PRIORITY

The present invention claims priority from Japanese application JP 2005-341356 fined on Nov. 28, 2005, the content of which is hereby incorporated by reference into this application.

FIELD OF THE INVENTION

The present invention relates to an AD converter (hereinafter referred to as AD converts) which converts an analog signal into a digital signal, and more specifically to a time-interleaved AD converter which converts an analog input signal by a plurality of low-speed high-resolution AD converters with clock phases shifted one after another and then cyclically multiplexes the converted signal to thereby obtain a digital signal equivalent to that obtained by conversion performed by a high-speed high-resolution AD converter.

BACKGROUND OF THE INVENTION

Typically, it is extremely difficult to achieve a high-speed high-resolution AD converter (for example, with a sampling speed of larger than several hundreds [MHz] and a resolution of larger than 10 [bit]). Therefore, this converter cannot be achieved, or this will be high-priced even if achieved. A low-price converter is obtained by sacrificing one of the required performances. That is, it is provided with high-speed and low-resolution (for example, with a sampling speed of larger than several hundreds [MHz] and a resolution of several bits) or with low-speed and high-resolution (for example, with a sampling speed of several tens [MHz] and a resolution of larger than 10 [bit]). As a technology of combining together a plurality of the latter low-speed high-resolution AD converters to thereby effectively achieve a high-speed high-resolution AD converter, there is a time-interleaved AD converter.

FIG. 1 shows an example of the basic configuration of the time-interleaved AD converter, showing a case where four low-speed high-resolution AD converters (ADC 0 to ADC 3) with a resolution of K1[bit] are combined together (M=4). FIG. 2 is a timing diagram of FIG. 1.

In principle, through frequency dividing of a clock CLK of 4×FS [Hz], FS[Hz], four-phase clocks CLK 0 to CLK 3 are created with a phase shift of 1/FS/4 [sec] in the FS [Hz].In the ADC 0 to ADC 3, by converting an analog input signal by use of these clocks and then cyclically multiplexing the converted signals SIG 0 to SIG 3, a digital signal x[n] can be obtained which is equivalent to that obtained by a high-speed high-resolution AD converter with a sampling speed of 4×FS [Hz] and a resolution of K1[bit].

However, in fact, due to influence of the presence of nonideality or variation, such as DC offset, conversion gain error, sampling timing error, and a frequency characteristic, each of the AD converters suffers from a problem that the x[n] has spurious.

To solve this problem, various compensation methods have been suggested. Now, considering the installation ease and usability, neither a method which requires an additional particular analog circuit nor a method which requires a special training signal, but a method is suitable by which compensation is made by using only a multipurpose component and digital signal processing based on only a signal desired to be converted. JP-A No. 2004-165988 "Digital Quadrature Demodulator" describes one example of such a method.

In the JP-A No. 2004-165988, the number of low-speed high-resolution AD converters is limited to 2; thus, speeding up effect is just twice the effect provided by a low-speed high-resolution AD converter alone. JP-A No.2004-328436, "A/D Converter" describes one example of a conventional technology in which the number of low-speed high-resolution AD converters can be increased.

In JP-A No. 2004-328436, "A/D Converter", linear filter operation is applied for compensation; thus, the compensation can be made even when each low-speed high-resolution AD converter has a frequency response.

SUMMARY OF THE INVENTION

In JP-A No. 2004-165988 "Digital Quadrature Demodulator", compensation is made for the DC offset so that the average of digital signals obtained by the low-speed high-resolution AD converters becomes equal to zero, while compensation is made for the conversion gain error so that conversion output powers are equalized. Therefore, this document includes an assumption that, when ideal conversion has been made, a converted signal does not have DC offset and powers become identical. Thus, an analog input signal needs to satisfy this assumption, thus resulting in a program that the input signal is limited and lacks versatility.

In JP-A No. 2004-328436, "A/D Converter", a coefficient required for the linear filter operation is previously stored in a table, but, if the characteristic of each of the low-speed high-resolution AD converters is subject to temperature variation or chronological variation, a mismatch occurs between a coefficient required for compensation and a value stored in the table, thus resulting in performance deterioration.

In the present invention, to avoid the first problem in JP-A No. 2004-165988 "Digital Quadrature Demodulator", i.e., the limitation imposed on the number of low-speed high-resolution AD converters, the number M of low-speed high-resolution AD converters is arbitrary.

To provide an analog signal with versatility, which JP-A No. 2004-165988 "Digital Quadrature Demodulator" failed to achieve (second problem), in order to generate an instruction signal d[n] which serves as a criterion for conversion error evaluation, a high-speed low-resolution AD converter is provided separately from the low-speed high-resolution AD converter, and the resolution of the high-speed low-resolution AD converter is so selected as to be set at K2<K1[bit].

If the DC offset in the low-speed high-resolution AD converter is sufficiently small, in order to correct other various deterioration factors, an output signal y[n] is obtained by an inner product of a vector signal Xv[n] and a weight vector Wv[n] in the invention. That is, linear filter operation indicated by Formula 1 below is applied.

$$y[n]=w1x[n]+w2x[n-1]+w3x[n-2]+ \ldots +w(N)x[n-(N-1)]$$ [Formula 1]

On the other hand, if the DC offset in the low-speed high-resolution AD converter is not ignorable, the output signal y[n] is obtained by the inner product of the vector signal Xv [n] and the weight vector Wv [n]. That is, nonlinear filter operation indicated by Formula 2 below is applied in which a constant term is added to the linear filter operation.

$$y[n]=w0x0+w1x[n]+w2x[n-1]+w3x[n-2]+\ldots+w(N)x[n-(N-1)]$$ [Formula 2]

Moreover, in the invention, to provide follow-up capability for system variation, which the JP-A No. 2004-328436, "A/D Converter" failed to achieve, a residual signal e[n]=d[n]−y[n] obtained by subtracting the output signal y[n] from the instruction signal d[n] is created, and then a product of the residual signal e[n] multiplied by a gain vector Kv[n] is added to the current weight vector Wv[n], thereby achieving updating to a weight vector Wv [n+M] after M number of samples. That is, time updating formula indicated by Formula 3 below is applied. Then, based on the vector signal Xv[n], the gain vector Kv[n] is generated by using such adaptive algorithm as to minimize a root mean square of the residual signal e[n].

$$Wv[n+M]=Wv[n]+Kv[n]e[n]$$ [Formula 3]

In this condition, since the resolution is K2<K1[bit], the output of the high-speed low-resolution AD converter is mixed with equivalently large quantization noise Nq. The Nq, however, does not correlate with an analog input signal, and thus is effectively smoothed in the adaptation process, thus having no influence on the output signal y[n].

As adaptation algorithm, Least Mean Square (LMS) algorithm or Recursive Least Square (RLS) algorithm disclosed in YOJI IIKUNI, "Adaptive Signal Processing Algorithm" by BAIFUKA, 2000, or SIMON HAYKIN "Introduction to adaptive filters" by GENDAIKOGAKUSHA, 1987 can be applied.

Now, the adaptation algorithm will be described. The LMS algorithm is featured by large convergence time but small operation amount, and the gain vector Kv[n] is provided by Formula 4 below by use of a positive number u, called a step gain or a step size parameter, which is close to zero.

$$Kv[n]=2u\ Xv[n]$$ [Formula 4]

On the other hand, the RLS algorithm is characterized by high speed but large operation amount. The gain vector Kv[n] is provided by Formula 5 below (with the dash sign representing transposition). Here, an intrinsic matrix P[n] is a positive symmetrical matrix, and its size is N×N when Formula 1 is applied and (N+1)×(N+1) when the Formula 2 is applied. Letter L denotes a positive number, called a forgetting factor, which is close to 1. As with the weight vector Wv[n], the matrix P[n] is also time-updated; it is updated in an updating formula thereof ONCE every M number of samples. In selection from among the adaptation algorithm described above, due to trade-off relationship existing between the convergence speed the operation amount, the selection can be made depending on which is given more importance.

$$P[n]=(P[n-M]-Kv[n]Xv[n]'P[n-M])/L$$ [Formula 5]

$$Kv[n]=P[n-M]Xv[n]/(L+Xv[n]'P[n-M]Xv[n])$$

According to an embodiment of the invention, first, no limitation is placed on the number of low-speed high-resolution AD converters; thus, the number M of converters can be arbitrary, thus permitting achieving sufficient speeding up.

Secondly, an instruction signal d[n] is obtained by use of a high-speed low-resolution AD converter to achieve operation so as to minimize error in the instruction signal; thus, no special assumption is required for an analog input signal, which can be thus provided with versatility.

Thirdly, an output signal y[n] is obtained by nonlinear filter operation in which a constant term is added to FIR filter operation; thus, the constant term contributes to compensation of DC offset, and the FIR filter operation contributes to compensation of conversion gain error, sampling timing error, and a frequency characteristic, which permits correction of all the nonideality described as the problems above.

Fourthly, the use of adaptation algorithm permits providing follow-up capability for system variation.

As effect of all described above, a time-interleaved AD converter can be achieved which has performance equivalent to that of a high-speed high-resolution AD converter with a sampling speed of M×FS [Hz] and a resolution of K1[bit].

DETAILED DESCRIPTION OF THE PREFERRED EMBODIMENTS

Figure 3:
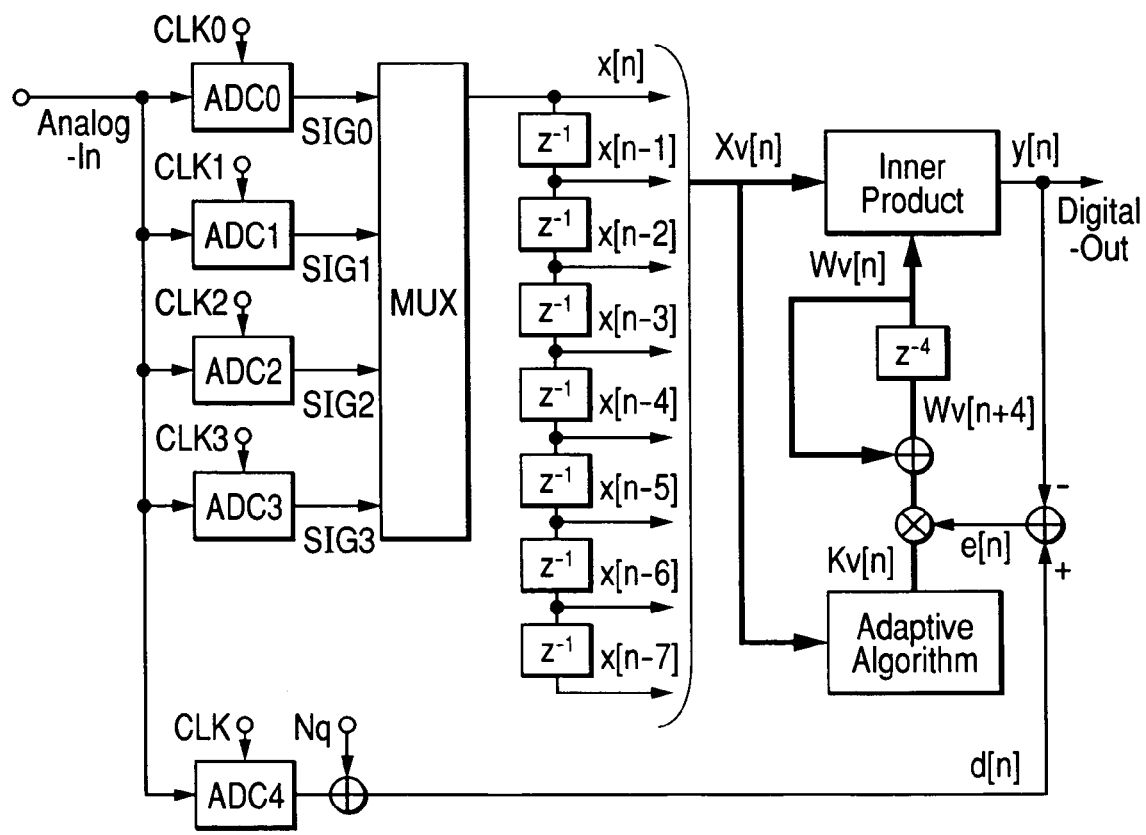
FIG. 3 shows a first embodiment of the invention.
Figure 4:
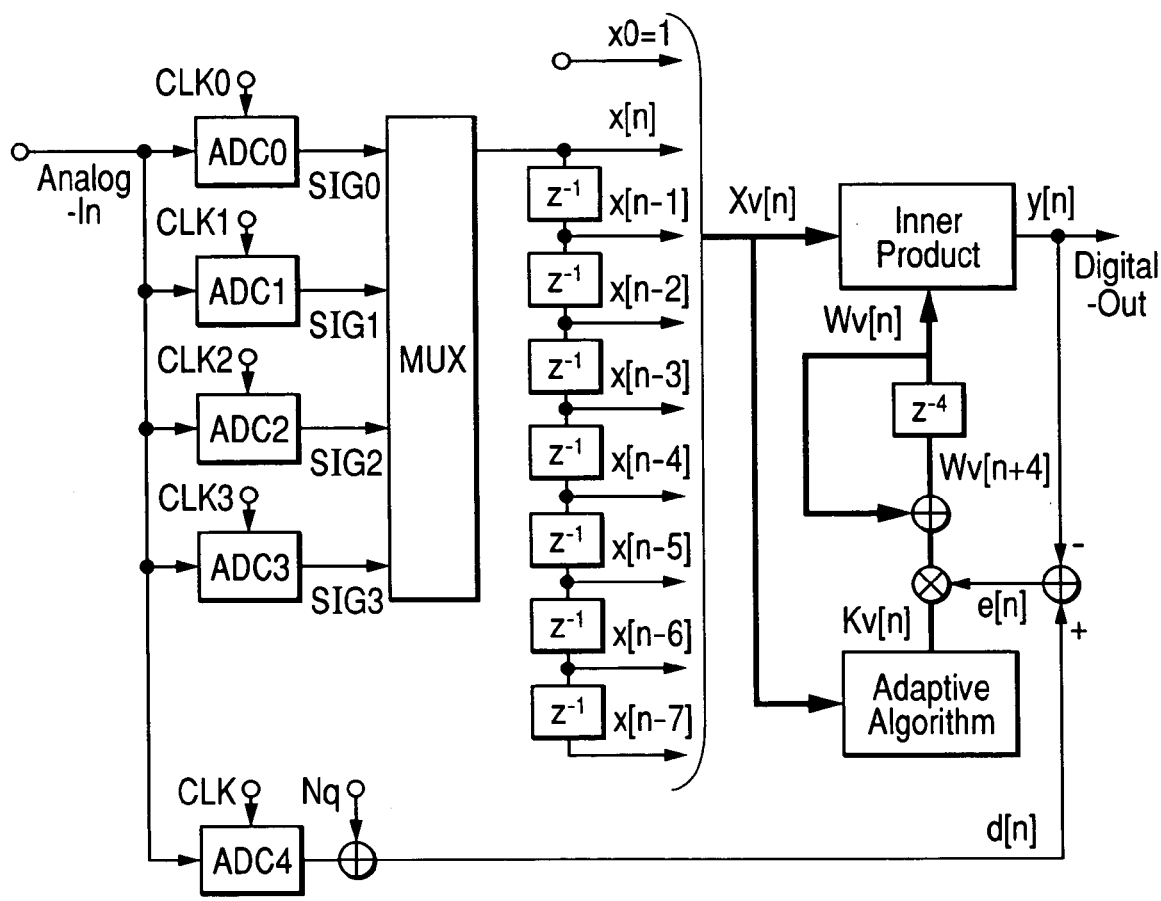
FIG. 4 shows a second embodiment of the invention.
Figure 5:
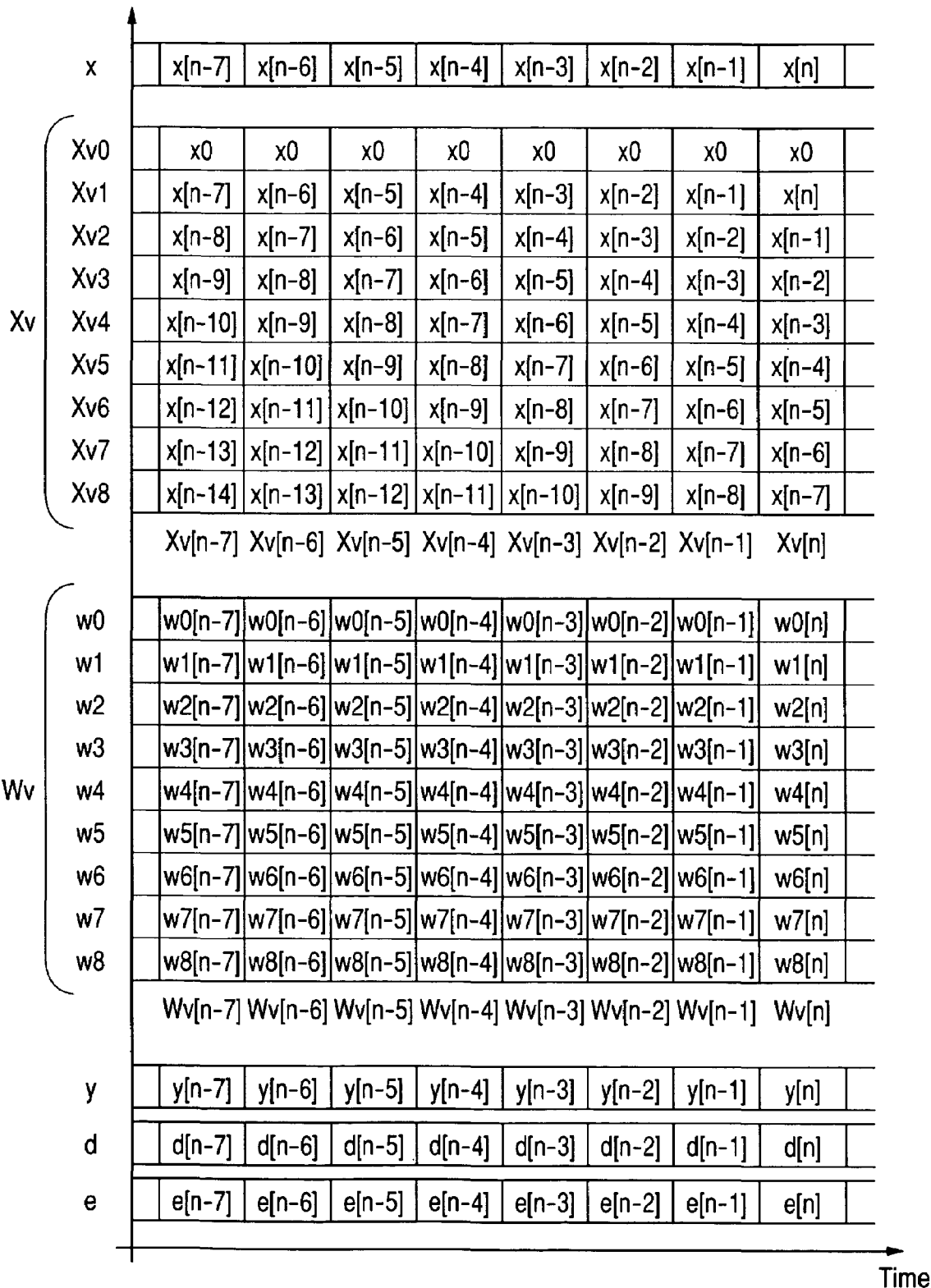
FIG. 5 is a timing diagram of FIG. 4.

Hereinafter, the present invention will be described. FIG. 3 is a first configuration example corresponding to Formula 1. FIG. 4 is a second configuration example corresponding to Formula 2. FIG. 4 includes FIG. 3; thus the description will be given, referring to FIG. 4. FIG. 5 is a timing diagram of FIG. 4.

In FIG. 4, four low-speed high-resolution AD converters ADC 0 to ADC 3 are used; thus, M is equal to 4. N becomes equal to 8 since inner product operation is performed by Formula 1 by use of the past samples 0 to 7 of an x[n]. Both the M and N are not specifically limited, and thus appropriate values may be so selected as to be in accordance with the design specifications. An increase in the M permits an increase in the conversion speed, although this is limited to the maximum conversion speed of a high-speed low-resolution AD converter ADC used for obtaining an instruction signal d[n]. An increase in the N permits an improvement in the compensation accuracy but results in an increase in the size (N+1) of a vector signal Xv[n] and a weight vector Wv[n], leading to complicated operation.

Through frequency dividing of a clock CLK of 4×FS [Hz], four-phase clocks CLK 0 to CLK 3 are created with a phases shift of 1/FS/4 [sec] in FS [Hz], and these clocks are supplied to the ADC 0 to ADC 3, respectively. An analog signal common among the ADC 0 to ADC 3 is converted, and the converted signals SIG 0 to SIC 3 are cyclically multiplexed to thereby obtain a digital signal x[n] with a resolution of K1[bit].

It is assumed that the low-speed high-resolution AD converters ADC 0 to ADC 3 have DC offset, conversion gain error, sampling timing error, and a frequency characteristic; thus, the digital signal x[n] includes error. Thus, compensation is performed by linear coupling between a constant number x0 (for example, x0=1) and the past 0 to 7 samples of the x[n]. That is, an inner product of vector signals Xv[n]=(x0, x[n], x[n−1], . . . , x[n−7])' of nine elements including the constant number x0 and the x[n], . . . , x[n−7] and weight vectors Wv[n]=(w0[n], w1[n], . . . , w7[n], w8[n])' of nine elements is taken to thereby obtain an output signal y[n] (with the dash signs representing transposition). This inner product operation includes the constant term, thus forming nonlinear filter.

Figure 1:
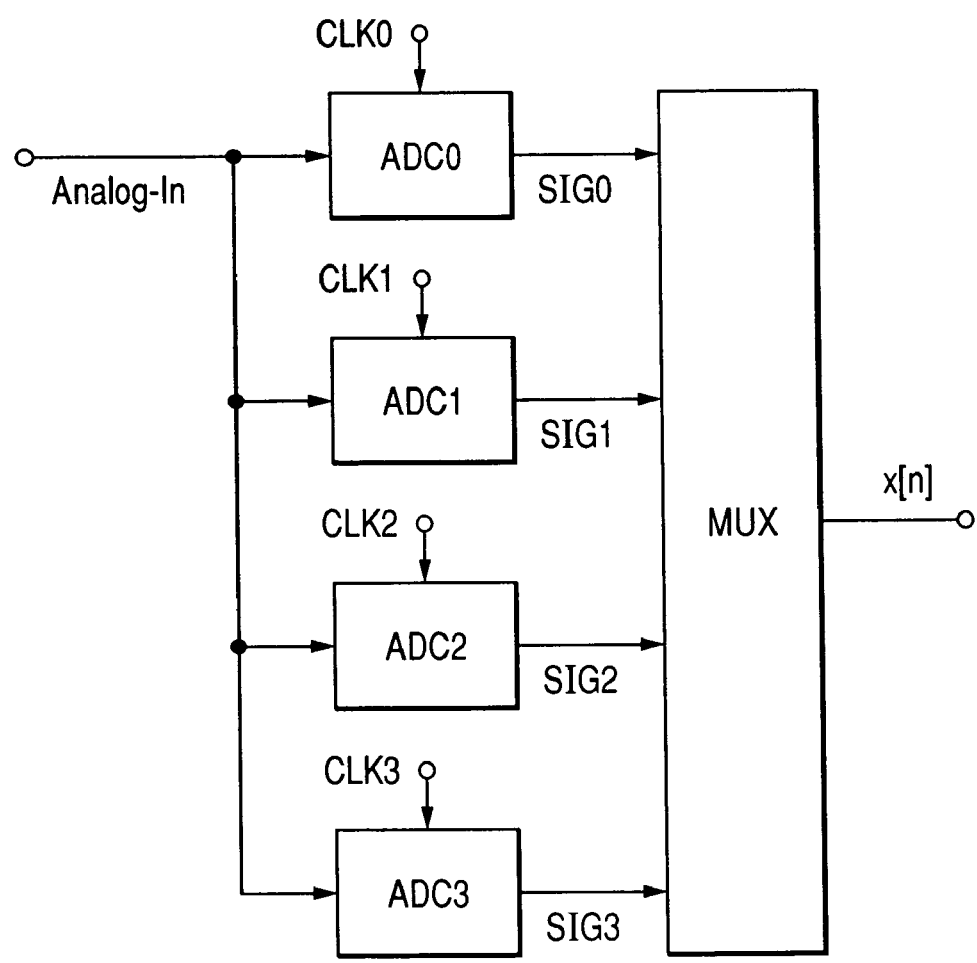
FIG. 1 shows the basic configuration of a time-interleaved AD converter.
Figure 2:
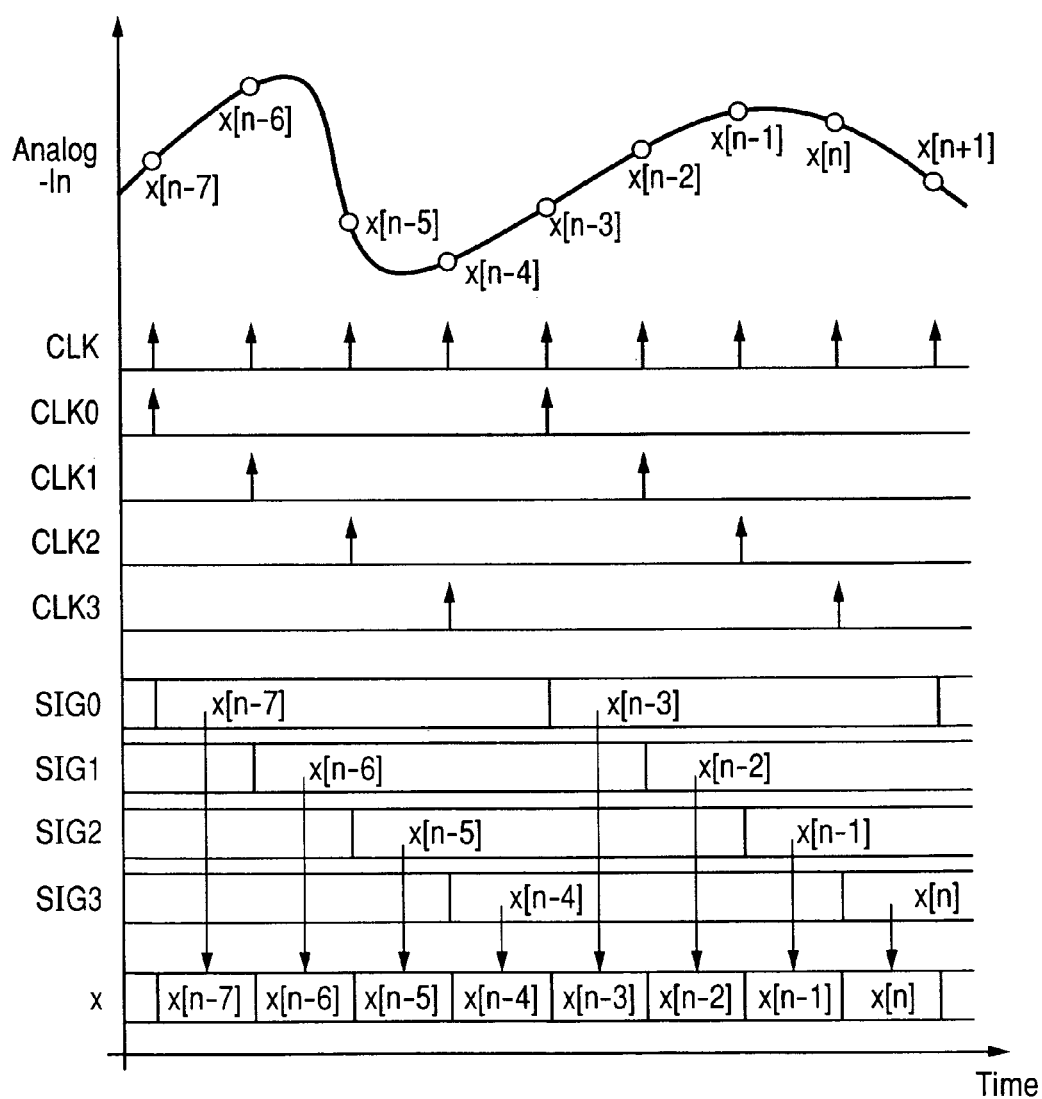
FIG. 2 is a timing diagram of FIG. 1.

Referring to FIG. 2, x[n], x[n−4], . . . are sample values subject to deterioration in the ADC 3, and in the same manner, x[n−1], x[n−5], . . . are subject to deterioration in the ADC 2, x[n−2], x[n−6], . . . are subject to deterioration in the ADC 1, and x[n−3], x[n−7], . . . are subject to deterioration in the ASC 0. Then, referring to FIG. 5, for example, in Xv[n] and Xv[n−4], the second element Xv1 and the sixth element Xv5 are subject to the deterioration in the ADC 3, the third element Xv2 and the seventh element Xv6 are subject to the deterioration in the ADC 2, the fourth element Xv3 and the eighth element Xv7 are subject to the deterioration in the ADC 1, and the fifth element Xv4 and the ninth element Xv8 are subject to the deterioration in the ADC 0. Applying this to other points, there are four periodically repeated patterns in which the Xv is subject to deterioration, including: Xv[n], Xv[n−4], . . . ; Xv[n−1], Xv[n−5], . . . ; Xv[n−2], Xv[n−6], . . . ; and Xv[n−3], Xv[n−7], . . . .

Therefore, in a steady state, in the weight vector Wv, Wv[n], Wv[n−4], . . . converge to the same vector, Wv[n−1], Wv[n−5], . . . converge to the same vector, Wv[n−2], Wv[n−6], . . . converge to the same vector, and Wv[n−3], Wv[n−7], . . . converge to the same vector. Since there are four different vector values, updating may be performed once every four samples.

Thus, a residual signal e[n]=d[n]−y[n] is created by subtracting the output signal y[n] from the instruction signal d[n], and a product of the residual signal e[n] multiplied by a gain vector Kv[n] is added to the current weight vector Wv[n] to thereby achieve updating to a weight vector Wv[n+4] after four samples.

Figure 6:
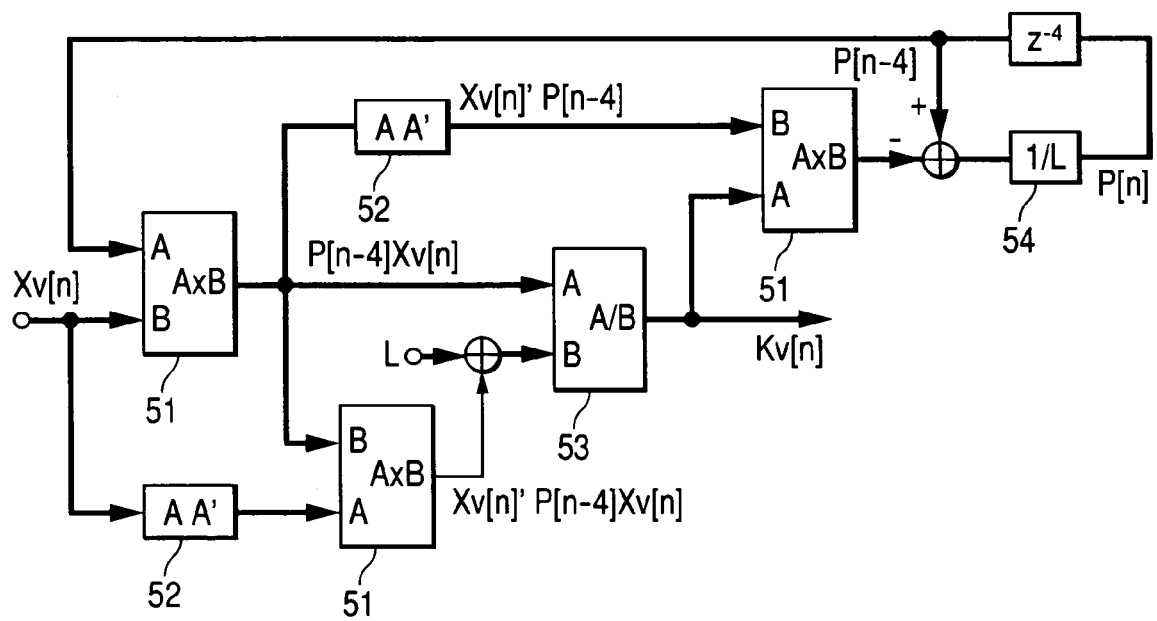
FIG. 6 is a signal flow diagram of RLS algorithm.

The gain vector Kv[n] described above is generated by applying such adaptation algorithm as to minimize the root mean square of the residual signal e[n] based on the vector signal Xv[n]. As one example, FIG. 6 shows a signal flow diagram when the RLS algorithm is applied. FIG. 6 is equivalent to the updating formula indicated by Formula 5. A signal indicated by the thick line denotes a vector signal or a matrix signal, and a signal indicated by the thin line denotes a scalar signal. As with the weight vector Wv, an intrinsic matrix P[n] may also be updated once every four samples.

Upon implementation of the RLS algorithm, if the operation word length is small, positive symmetry property of the matrix P[n] may collapse and thus become unstable due to the influence of quantization error. In such a case, as disclosed in YOJI IIKUNI, "Adaptive Signal Processing Algorithm" by BAIFUKA, 2000, the stability can be ensured by modification such that the matrix P[n] is subjected to UD factorization into the form of a product of diagonal matrix and a triangular matrix and then an element of each of the diagonal matrix and the triangular matrix is time-updated.

Figure 7:
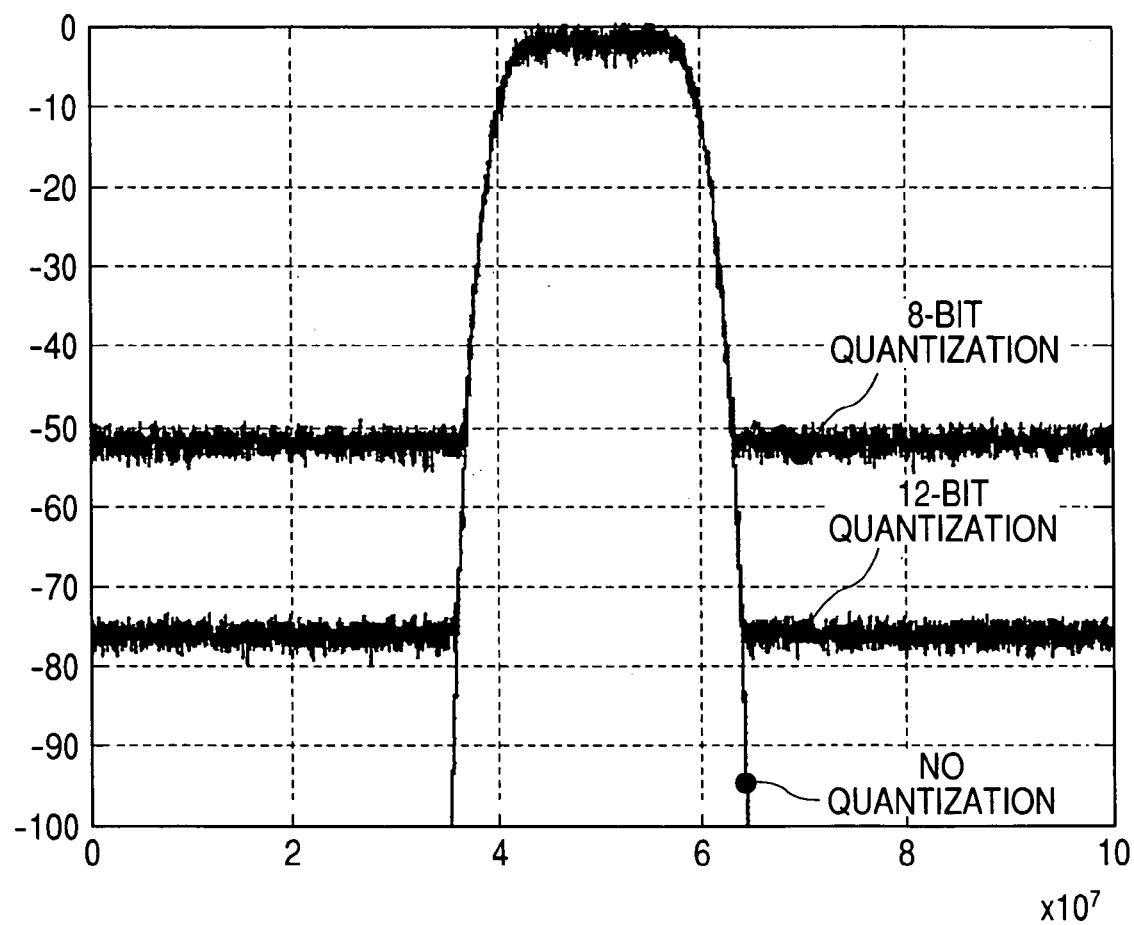
FIG. 7 shows a power spectrum (for comparison)

Next, simulation results will be described. FIG. 7 shows a power spectrum plotted for comparison. In FIG. 7, a random signal of a bandpass type with a band of approximately 20 [MHz], having a signal amplitude of approximately 4 [p-p], is used as an analog input signal. FIG. 7 shows three cases including: where this analog input signal is ideally sampled with FS=200 [MHz]; where it is sampled with 12 [bit] quantization; and where it is sampled with 8[bit] quantization. The horizontal axis indicates the frequency axis [Hz], and the vertical axis indicates the power displayed in relative values [dB].

Next, a description will be given on results of simulation performed under the condition that the low-speed high-resolution AD converters ADC 01 to ADC 3 have a sampling speed of 50 [MHz] and a resolution of K1=12 [bit] and the high-speed low-resolution AD converter ASC 4 has a sampling speed of FS=200 [MHz] and a resolution of K2=8 [bit].

First, as an example of a factor of deterioration in the low-speed high-resolution AD converters ADC 0 to ADC 3, conversion gain error and sampling timing error as in Table 1 are assumed. In this case, DC offset compensation is not required, and thus the configuration of FIG. 3 is effective.

Figure 8:
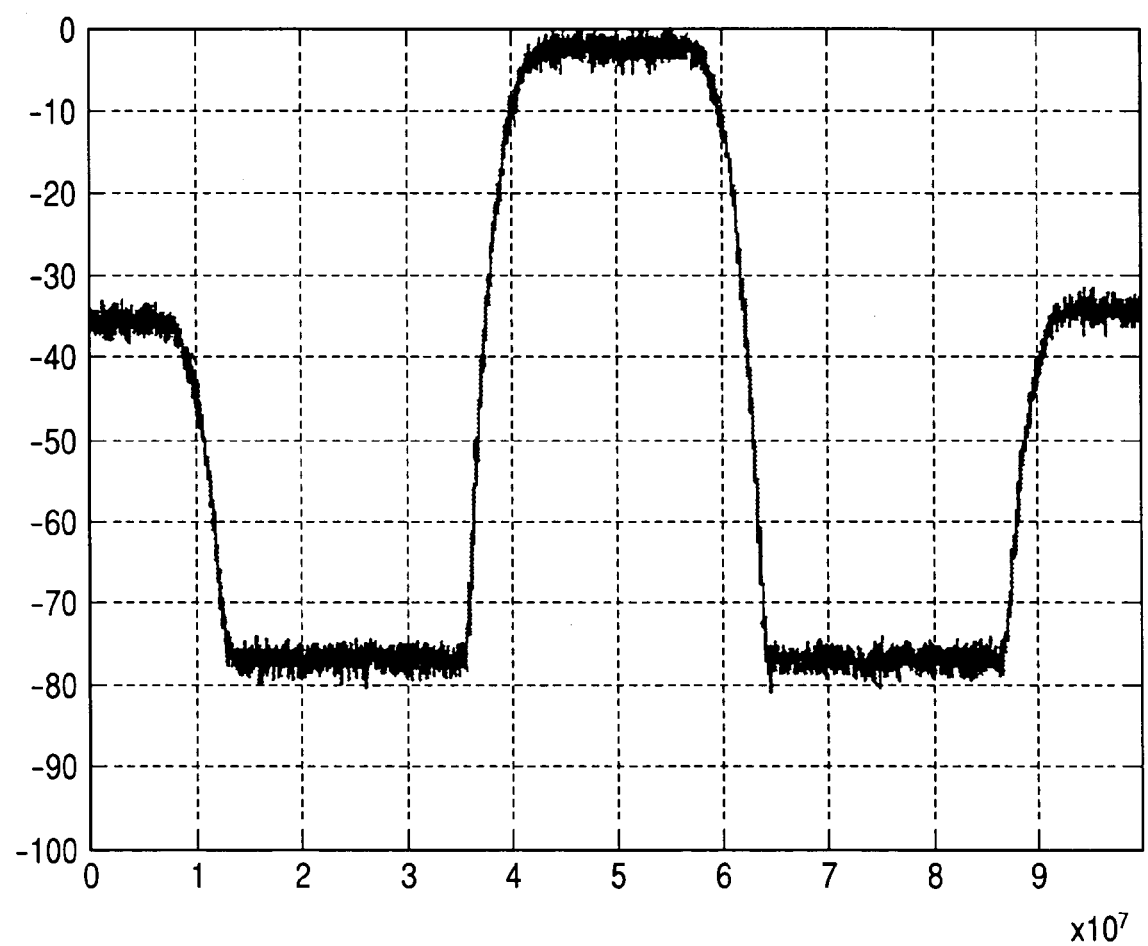
FIG. 8 is a diagram with conversion gain error and timing error added and without compensation.
Figure 9:
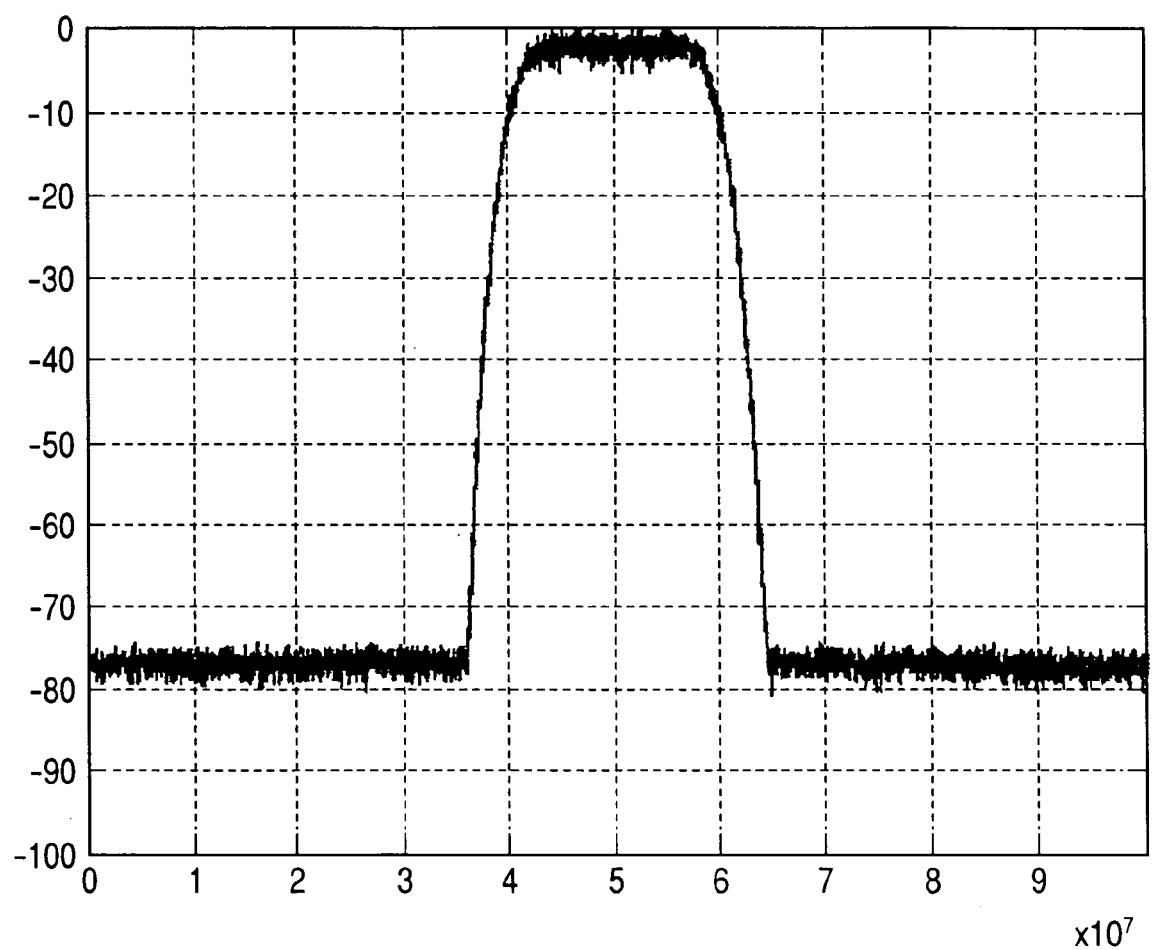
FIG. 9 is a diagram with conversion gain error and timing error added and with compensation applied to the configuration of FIG. 3.

FIG. 8 shows a power spectrum of the x[n], and FIG. 9 shows a power spectrum of the y[n]. FIG. 9 shows the power spectrum corresponding to the period after a steady state has been reached following some progress in adaptive operation started with an appropriate initial value of the weight vector Wv.

In FIG. 8, near the zero frequency and near the Nyquist frequency, spurious, which is not present in an input signal, is observed, but it is sufficiently corrected in FIG. 9. Moreover, as is clear from comparison with FIG. 7, for noise floor, the same performance as is obtained by sampling with a sampling speed of 200 [MHz] and a resolution of 12[bit] is obtained.

TABLE 1

| Converter | Deterioration parameter | |
|---|---|---|
| | Conversion gain | Sampling timing error |
| ADC0 | 1.05 | 0.08/FS |
| ADC1 | 1.08 | 0.06/FS |
| ADC2 | 1.06 | 0.05/FS |
| ADC3 | 1.08 | 0.09/FS |

Figure 10:
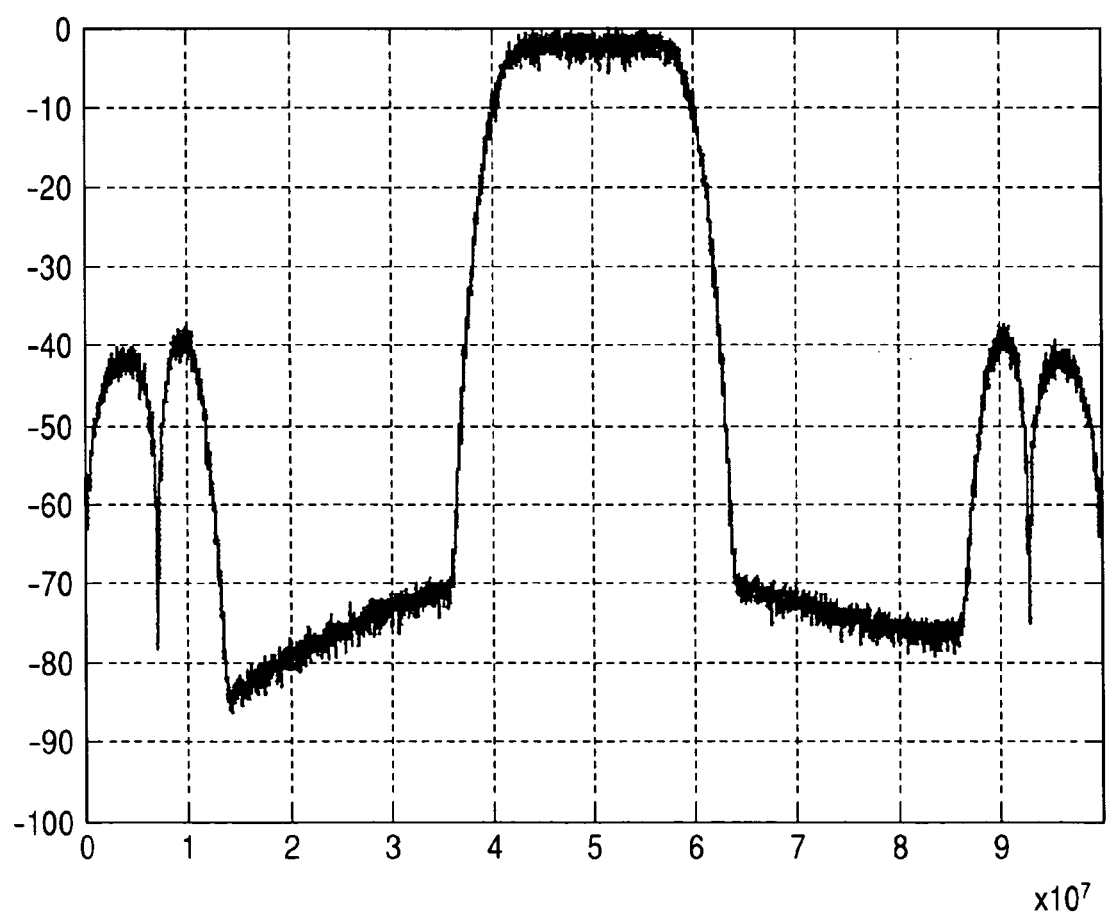
FIG. 10 is a diagram with offset, conversion gain error, and timing error added and with compensation applied to the configuration of FIG. 3.

Here, applying the deterioration parameters of Table 2 in which DC offset is added to the configuration of FIG. 3 results in incomplete compensation due to absence of a DC offset correction function, thus causing spurious as shown in FIG. 10 to appear in the y[n].

TABLE 2

| Converter | Deterioration parameters | | |
|---|---|---|---|
| | DC offset | Conversion gain | Sampling timing error |
| ADC0 | +0.01 | 1.05 | 0.08/FS |
| ADC1 | +0.02 | 1.08 | 0.06/FS |

TABLE 2-continued

| | Deterioration parameters | | |
| Converter | DC offset | Conversion gain | Sampling timing error |
| --- | --- | --- | --- |
| ADC2 | −0.02 | 1.06 | 0.05/FS |
| ADC3 | −0.03 | 1.08 | 0.09/FS |

Figure 11:
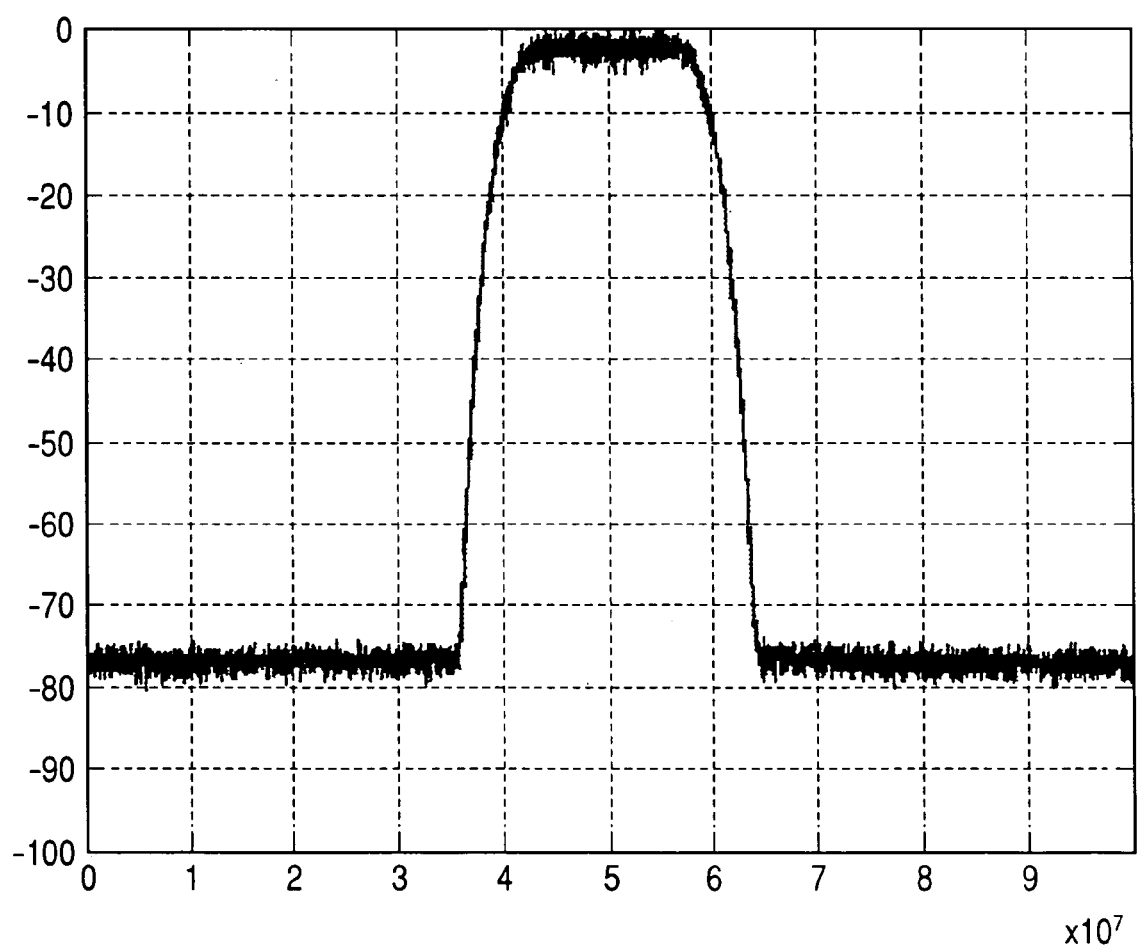
FIG. 11 is a diagram with offset, conversion gain error, and timing error added and with compensation applied to the configuration of FIG. 4.

In such a case, the configuration of FIG. 4 is effective. FIG. 11 shows a power spectrum of the y[n]. FIG. 11 shows the power spectrum corresponding to the period after a steady state has been reached following progress in adaptive operation started with an appropriate initial value of the weight vector Wv.

The spurious observed in FIG. 10 is sufficiently compensated in FIG. 11. Moreover, as is clear from comparison with FIG. 7, for noise floor, the same performance as is obtained by sampling with a sampling speed of 200 [MHz] and a resolution of 12 [bit] is obtained.

As described above, According to an embodiment of the invention, use of four low-speed high-resolution AD converters with a sampling speed of 50 [MHz] and a resolution of 12 [bit] in combination with a high-speed low-resolution AD converter with a sampling speed of 200 [MHz] and a resolution of 8[bit] permits achieving a time-interleaved AD converter which is equivalent to a high-speed high-resolution AD converter with a sampling speed of 200 [MHz] and a resolution of 12 [bit].

Figure 12:
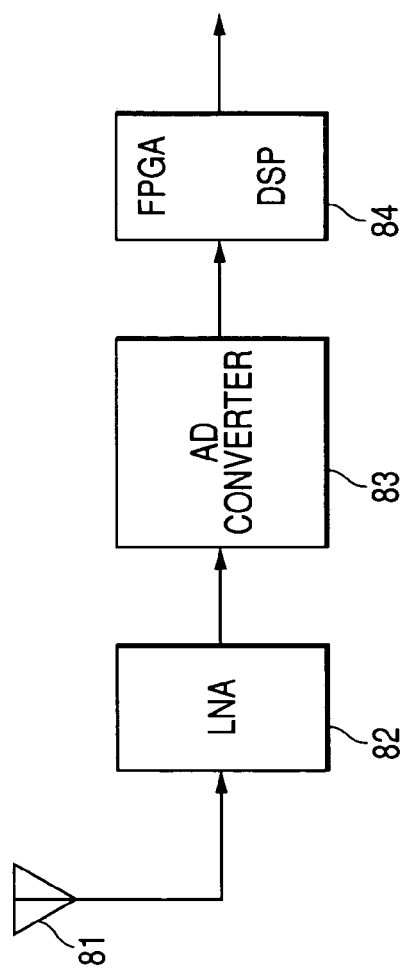
FIG. 12 shows a receiver of a software defined radio.

Next, a software defined radio using the time-interleaved AD converter of the invention as a receiver will be described. FIG. 12 is block diagram of the receiver of the software defined radio. An RF signal received by an antenna 81 is amplified by a low noise amplifier 82, and the signal is then converted into a digital signal by the time-interleaved AD converter 83. To support multimode reception, signal processing, such as filtering and frequency conversion, is performed by a digital signal processor 84 composed of reconfigurable FPGA and DSP. To perform multiband reception, the AD converter 83 is required to have a high speed as high as several hundreds [MHz] or more. To further capture a minute received signal, it is preferable that the resolution be 10 [bit] or more. An AD converter having such a characteristic cannot be achieved, or will be considerably high-priced even if achieved. However, the use of the time-interleaved AD converter of the invention permits achieving it at low costs.

Figure 13:
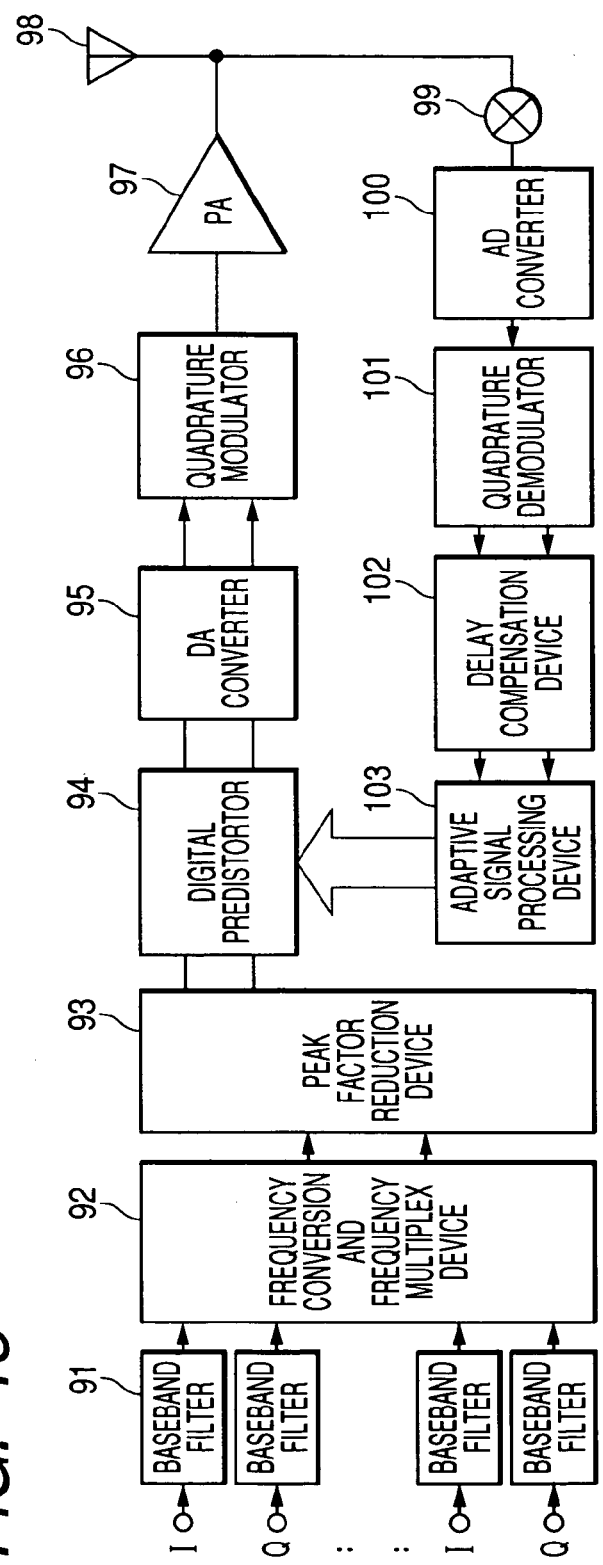
FIG. 13 shows a digital predistorsion transmitter.

Next, a digital predistorsion transmitter using the time-interleaved AD converter of the invention will be described. FIG. 13 is a block diagram of the digital predistorsion transmitter.

In FIG. 13, band limiting processing is performed on a multicarrier IQ input signal by a baseband filter 91. In a frequency conversion and frequency multiplex device 92, frequency conversion is performed by use of a complex carrier wave corresponding to a separation frequency of multicarrier transmission, and frequency multiplexing is performed by adding each carrier. As a result, due to central limit theorem for a random signal, the signal becomes closer to a normal distribution signal, thus causing a peak amplitude component which is larger by 10 dB than the average power, although the probability of this occurrence is low. Thus, in a peak factor reduction device 93, while maintaining the form of a power spectrum, the amplitude component equal to or larger than a specified threshold value is removed. Next, in a distortion compensator 94, predistorsion processing applying complex polynomial operation is performed. After conversion into an analog signal by a DA converter 95, frequency conversion up to an RF band is performed by a quadrature modulator 96, then sufficient amplification is performed by the power amplifier 97, and then the signal is outputted from the antenna 98 into the air. At this point, due to a non-linear input and output characteristic of the power amplifier 97, non-linear distortion occurs.

Next, part of the output signal is branched, down-converted into an IF signal by a mixer 99, and converted into a digital signal by an AD converter 100. This digital IF signal is subjected to quadrature demodulation by use of a digital complex carrier wave in a quadrature demodulator 101. The demodulated signal is subject to delay in the path from the DA converter 95 to the quadrature demodulator 101, which is thus compensated by a delay compensation device 102. In an adaptive signal processing device 103, to minimize a non-linear distortion component included in the signal whose delay has been compensated, for example, based on LMS algorithm, a coefficient of the complex polynomial operation described above is automatically calculated. Through digital predistorsion operation based on the series of operations described above, the occurrence of intermodulation distortion can be suppressed even in multicarrier transmission.

At this point, the AD converter 100 converts the IF signal, which requires high speed operation, but the use of the time-interleaved AD converter of the invention permits achieving this operation at low costs.

What is claimed is:

1. A time-interleaved AD converter, comprising:

M number of first AD (analog to digital) converters ADC0 to ADC(M−1) with a sampling speed of FS [Hz] and a resolution of K1[bit]; and a second AD converter ADC (M) with a sampling speed of M×FS [Hz] and a resolution of K2<K1[bit], wherein the time-interleaved AD converter, after commonly connecting together analog input terminals of the first AD (analog to digital) converters ADC 0 to ADC (M−1), performs analog to digital conversion by M-phase clocks CLK 0 to CLK (M−1) with a delay of 1/FS/M [sec] in timing one after another, and cyclically multiplexes obtained digital signals SIG 0 to SIG (M−11) in synchronous with a clock of M×FS[Hz] to thereby obtain a digital signal x[n] with a sampling speed of M×FS [Hz] and a resolution of K1[bit], generates an output signal y[n] through linear filter operation based on an inner product of vector signals Xv[n]=(x[n], x[n−1], . . . , x[n−(N−1)])' of an N number of signals as elements with a sample delay of 0, 1, . . . , N−1, respectively, in the x[n], and weight vectors Wv[n]=(w1, . . . , w(N−1), w(N))' of an N number of elements (with the dash signs representing transposition), connects the second AD converter ADC (M) so as to have the input terminals in common with the first AD converters ADC 0 to ADC (M−1) to thereby obtain an instruction signal d[n], creates a residual signal e[n]=d[n]−y[n] by subtracting the output signal y[n] from the instruction signal d[n], and adds a product of the residual signal e[n] multiplied by a gain vector Kv[n] to the current weight vector Wv[n] so as to perform updating to a weight vector Wv[n+M] after M number of samples, and generates the gain vector Kv[n] based on the vector signal Xv[n] by applying adaptation algorithm which operates so as to minimize a root mean square of the residual signal e [n].

2. The time-interleaved AD converter according to claim 1, wherein a constant number x0 is added as an element to the vector signals Xv[n] of the N number of elements to thereby provide vector signals Xv[n]=(x0, x[n], x[n−1], . . . , x[n−(N−1)])' of an (N+1) number of elements, and the weight vectors corresponding thereto are also extended to provide Wv[n]=(w0, w1, . . . , w(N−1), w(N))' (with the dash signs representing transposition) of an (N+1) number of elements, thereby creating the output signal y[n] through nonlinear filter operation based on an inner product of the Xv[n] and the Wv [n].

3. The time-interleaved AD converter of to claim 1, wherein the adaptation algorithm is Least Mean Square (LMS) algorithm.

4. The time-interleaved AD converter according to claim 1, wherein the adaptation algorithm is Recursive Least Square (RLS) algorithm, and, as with the weight vector Wv[n], an intrinsic matrix P[n] is also updated once every M number of samples.

5. A software defined radio comprising a receiver including an antenna for receiving a radio signal and the time-interleaved AD converter according to claim 1 which converts the received signal into a digital signal and outputs the signal to a digital signal processor.

6. A digital predistorsion transmitter comprising:

a distortion compensator which performs predistorsion processing on a transmitted signal;

a digital to analog converter which converts the transmitted signal subjected to the predistorsion processing from a digital signal into an analog signal;

a power amplifier which amplifies the analog signal outputted from the digital to analog converter and outputs the signal to an antenna; and the time-interleaved AD converter according to claim 1 which converts the output of the power amplifier into a digital signal for use in the predistorsion processing in the distortion compensator.

* * * * *